United States Patent
Yu

(10) Patent No.: US 6,518,899 B2
(45) Date of Patent: Feb. 11, 2003

(54) METHOD AND APPARATUS FOR SPECTRAL SHAPING OF NON-LINEARITY IN DATA CONVERTERS

(75) Inventor: Xianggang Yu, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/978,139

(22) Filed: Oct. 15, 2001

(65) Prior Publication Data

US 2002/0190884 A1 Dec. 19, 2002

Related U.S. Application Data

(60) Provisional application No. 60/297,990, filed on Jun. 13, 2001.

(51) Int. Cl.[7] .............................................. H03M 1/06
(52) U.S. Cl. ........................ 341/118; 341/120; 341/155; 341/143; 341/144
(58) Field of Search ................................ 341/143, 144, 341/155, 120, 118

(56) References Cited

U.S. PATENT DOCUMENTS

| | | | |
|---|---|---|---|
| 5,221,926 A | | 6/1993 | Jackson |
| 5,257,026 A | * | 10/1993 | Thompson et al. ......... 341/118 |
| 5,305,004 A | * | 4/1994 | Fattaruso ................... 341/143 |
| 5,329,282 A | | 7/1994 | Jackson |
| 5,404,142 A | * | 4/1995 | Adams et al. .............. 341/118 |
| 5,684,482 A | | 11/1997 | Galton |
| 5,856,799 A | | 1/1999 | Hamasaki et al. |
| 5,982,317 A | | 11/1999 | Steensgaard-Madsen |
| 6,313,775 B1 | * | 11/2001 | Lindfors et al. ............ 341/118 |
| 6,340,940 B1 | * | 1/2002 | Melanson ................... 341/143 |
| 6,369,733 B1 | * | 4/2002 | Tucker et al. ............... 341/143 |
| 6,384,761 B1 | * | 5/2002 | Melanson ................... 341/118 |

* cited by examiner

Primary Examiner—Michael Tokar
Assistant Examiner—Lam T. Mai
(74) Attorney, Agent, or Firm—W. Daniel Swayze, Jr.; W. James Brady; Frederick J. Telecky, Jr.

(57) ABSTRACT

An improved dynamic element matching technique for providing noise-shaping of non-linearity in data converters, such as a multi-bit digital-to-analog converter, is provided. The improved DEM technique is configured with a new method for generating the bit patterns, which permits a less complex digital DEM circuit that provides improved performance. The proposed DEM algorithm introduces a new priority calculation method in which a multi-bit quantizer can be used in an oversampled delta sigma modulator to produce an output which is converted to an output code, such as a thermometer code output. The thermometer code output can be coupled as input bits through a dynamic element matching sort block to provide an output comprising a plurality of bits. Each output bit of the dynamic element matching sort block is sampled and coupled back to each of a plurality of corresponding filters, which comprise cascaded integrators. The sort block is configured to compare the respective outputs of each filter to shuffle the input bits to generate an output such that the filter output values converge towards each other. In this way, the bit sequence on each output bit line will have the noise-shaping with the order determined by the number of integrators cascaded in the signal path of each filter. The resultant output signals can then be passed through an internal multi-bit DAC to provide an output to an analog low-pass filter to remove out-of-band noise, leaving the signal band having an improved signal-to-noise (SNR) with the non-linearity components removed.

25 Claims, 5 Drawing Sheets

| CNT0 | CNT1 | CNT2 | CNT3 | c01 | c02 | c03 | c12 | c13 | c23 | p0 | p1 | p2 | p3 | X0 | X1 | X2 | X3 | Y0 | Y1 | Y2 | Y3 |
|------|------|------|------|-----|-----|-----|-----|-----|-----|----|----|----|----|----|----|----|----|----|----|----|----|
| 0 | 0 | 0 | 0 | 0 | 0 | 0 | 0 | 0 | 0 | 0 | 1 | 2 | 3 | 1 | 0 | 0 | 0 | 1 | 0 | 0 | 0 |
| 1 | 0 | 0 | 0 | 1 | 1 | 1 | 0 | 0 | 0 | 3 | 0 | 1 | 2 | 1 | 0 | 0 | 0 | 0 | 1 | 0 | 0 |
| 1 | 1 | 0 | 0 | 1 | 1 | 1 | 1 | 1 | 0 | 3 | 2 | 0 | 1 | 1 | 0 | 0 | 0 | 0 | 0 | 1 | 0 |
| 1 | 1 | 1 | 0 | 1 | 1 | 1 | 1 | 1 | 1 | 3 | 2 | 1 | 0 | 1 | 0 | 0 | 0 | 0 | 0 | 0 | 1 |
| 0 | 0 | 0 | 0 | 1 | 1 | 1 | 1 | 1 | 1 | 3 | 2 | 1 | 0 | 1 | 0 | 0 | 0 | 0 | 0 | 0 | 1 |
| 0 | 0 | 0 | 1 | 1 | 1 | 0 | 0 | 0 | 0 | 2 | 1 | 0 | 3 | 1 | 0 | 0 | 0 | 0 | 1 | 0 | 0 |
| 0 | 0 | 1 | 1 | 0 | 0 | 0 | 0 | 0 | 0 | 1 | 0 | 2 | 3 | 1 | 0 | 0 | 0 | 1 | 0 | 0 | 0 |
| 0 | 1 | 1 | 1 | 0 | 0 | 0 | 0 | 0 | 0 | 0 | 1 | 2 | 3 | 1 | 1 | 0 | 0 | 1 | 0 | 0 | 0 |
| 0 | 0 | 0 | 0 | 0 | 0 | 0 | 0 | 0 | 0 | 0 | 1 | 2 | 3 | 1 | 1 | 0 | 0 | 1 | 1 | 0 | 0 |
| 1 | 1 | 0 | 0 | 0 | 1 | 1 | 1 | 1 | 0 | 2 | 3 | 0 | 1 | 1 | 1 | 0 | 0 | 0 | 0 | 1 | 1 |
| 0 | 0 | 0 | 0 | 0 | 1 | 1 | 1 | 1 | 0 | 2 | 3 | 0 | 1 | 1 | 1 | 1 | 0 | 1 | 0 | 1 | 1 |

FIG. 7

METHOD AND APPARATUS FOR SPECTRAL SHAPING OF NON-LINEARITY IN DATA CONVERTERS

CROSS REFERENCE TO RELATED APPLICATION

The application claims the benefit of U.S. Provisional Application No. 60/297,990, filed Jun. 13, 2001, the entire contents of which are incorporated by reference.

FIELD OF INVENTION

The present invention relates to a technique for spectral or noise-shaping the error resulting from non-linearity in imperfectly matched elements of data converters and, more particularly, to a method and circuit comprising an improved dynamic element matching technique for providing noise-shaping of the non-linearity in the data converters, such as an oversampling multi-bit digital-to-analog converter.

BACKGROUND OF THE INVENTION

The demand for more reliable integrated circuit components for use in communication, instrumentation and high quality video and audio applications continues to increase. As a result, integrated circuit manufacturers are requiring such components and devices meet the design requirements of a myriad of emerging applications. In particular, integrated circuit manufacturers are requiring data converters, modulators and related components to continue to improve data rates, noise reduction, linearity and accuracy.

A popular technique for implementing analog-to-digital converters includes the use of delta-sigma modulation wherein an analog voltage is input to a delta-sigma modulator. Such modulators produce noise, e.g., quantization and thermal noise, which must be filtered out by a digital filter at outside of signal band. The digital filter generally uses decimation in the filtering process, with the result that the digital data are generated at a much slower rate than the output rate of the modulator, e.g., by digitally converting the sampling rate of the signal from a given rate to a lower rate. This filtering process is generally operable to remove large amounts of noise at the cost of reducing the bandwidth of the analog-to-digital converter.

Single-bit or one-bit modulators have achieved popularity for use in integrated circuit data converters, such as digital-to-analog converters (DAC) and analog-to-digital converters (ADC), because these single-bit modulators generally employ a single-bit internal DAC that does not require precision component matching. As a result, these kinds of DACs and ADCs can be implemented using standard digital CMOS processes without the requirement of costly thin-film resistors or laser trimming techniques. However, the resolution that such single-bit modulators can achieve at a particular oversampling ratio is generally limited. While increasing the loop filter order can improve the resolution, the improvements tend to diminish rapidly due to instability. Moreover, because of the existence of significant out-of-band quantization noise in delta-sigma modulators, the design of an analog output filter for oversampled DAC's can be difficult to achieve.

In order to enhance the stability and reduce the quantization noise, a multi-bit quantizer is frequently used in an oversampled delta-sigma modulator. One advantage of noise-shaping modulators that utilize multi-bit quantizers is that the ratio of the total quantization noise power to the signal power occurring at the modulator output can be dramatically reduced from that of a single-bit modulator. As a result, the overall resolution of an oversampled data converter can be suitably increased, without an increase in the oversampling ratio, by increasing the number of levels in the internal data converters. Moreover, the decrease in quantization noise power that results in improved resolution also serves to reduce the output filter requirements for removing the out-of-band quantization noise. In addition, the modulator intends to be more stable with more levels of quantization.

With reference to FIG. 1, prior art noise-shaping modulators employing multi-bit internal quantizers are illustrated. Such multi-bit quantizers can be suitably implemented in ADCs and DACs. In both applications, a multi-bit DAC is required. For example, a multi-bit DAC is implemented inside the feedback loop for the ADC, as shown in FIG. 1A, and at the digital modulator output outside of the feedback loop for the DAC, as shown in FIG. 1B.

One limitation with a multi-bit DAC is that the characteristic of perfect linearity that exists with single-bit quantizer is eliminated. For example, for a case of a single bit., i.e., N=1, there are only two output levels, which fails to introduce any non-linearity. However, as N>1, the resulting multiple output levels introduce non-linearity. One reason these multilevel outputs introduce non-linearity is because of component mismatch, which causes a distortion on the input signal to the modulator. This distortion usually presents as harmonics of the input signal, which is a serious problem for some applications, for example, audio data conversion.

With reference to FIG. 2, another prior art internal DAC topology utilizes a $2^N$ parallel unit elements of approximately equal value, where N again denotes the number of bits. One technique for improving the accuracy and performance of the internal DAC topology consists of improving the matching of the individual elements. For example, one-time trimming methods comprising the laser trimming of components, such as the resistor trimming for digital audio applications, or the trimming of capacitors, such as the switching of very small capacitors in a parallel arrangement, can be implemented. However, variations in matching the temperature and power supply voltage can make this process difficult. Another trimming method comprises repeated trimming techniques which utilize on-chip hardware for trimming, but which can introduce accuracy and complexity problems.

Another approach for dealing with the non-linearity problems for multi-bit data converters comprises the use of dynamic element matching (DEM). The DEM technique comprises the transformation of the non-linearity error caused by mismatch into random noise, and then further noise-shaping the non-linearity by changing the bit pattern of data such that most of the noise falls outside the signal band, i.e., out-of-band noise, that can be filtered out, such as by decimation filtering. In other words, the DEM technique is configured to take advantage of the filter that follows the output of a data converter and that can suitably remove high-frequency noise by converting the static error into a wide-band noise signal using DEM algorithms. In general, the element mismatch can be converted from a static error into a wide-bandwidth noise by selecting different elements to represent a digital input code K at different times.

One approach for DEM comprises randomization, wherein different elements can be randomly chosen to represent the Kth level as a function of time. For example, with reference to FIG. 3, a block diagram of a parallel-unitelement internal DAC topology comprising randomization is illustrated. This DAC requires the use of a redundant code, such as, by way of example, a thermometer code or a linear code. In operation, the interconnection between the output of a thermometer decoder and the unit elements can be determined at random for each time period, with each unit element being assigned to only one thermometer decoder output for that time period. While randomization can normally eliminate some integral non-linearity, the in-band signal-to-noise ratio (SNR) is also significantly decreased. For example, the noise converted from non-linearity error by randomization is equally distributed across the whole band, including the signal band and the out band.

Another prior art DEM technique comprises dynamic element rotation, using a barrel shifter technique, to modulate the non-linearity error around the subharmonics of the sampling clock frequency by making the mismatch noise appear as a periodic signal, rather than producing white noise from the element mismatching characteristics. This process is configured to rotate the connections between the thermometer decoder and the unit elements, such as through use of a barrel shifter. Unfortunately, when the input to the internal DAC is not constant, some noise power can appear in the passband region. Further, unwanted tones can result from the mixing between the element mismatch noise and the tones in the quantization noise.

Yet another prior art DEM technique comprises individual level averaging which attempts to improve the SNR in the passband compared to randomization while also avoiding the generation of tones such as in rotation methods. This technique attempts to provide for each of the elements to be used with equal probability for each digital input code, and can be implemented through two manners, including rotation and addition. Each manner is configured to use each of the elements as selected by indices, and then wrap around again to the first element.

With reference to FIG. 4, an example of such an addition technique is disclosed more fully in U.S. Pat. No. 5,221,926 to Jackson. In the addition implementation, "1's" are assigned circularly to each output bit, such as output bits d0 through d4. For example, when there are two "1's" in an input sample, the "1's" can only be assigned to output bits d0 and d1, d1 and d2, d2 and d3 or d3 and d0. Because of this, the addition implementation, at best, can only achieve $1^{st}$ order noise-shaping.

In addition to the above specific problems, DEM techniques generally add significant overhead into the design of multi-bit data converters, especially those with good performance. Accordingly, a need exists for a cost-effective DEM technique to provide for high performance data converters.

SUMMARY OF THE INVENTION

The method and circuit according to the present invention addresses many of the shortcomings of the prior art. In accordance with various aspects of the present invention, an improved dynamic element matching technique for providing noise-shaping of non-linearity in data converters, such as a multi-bit digital-to-analog converter, is provided. The improved DEM technique is configured with a new method for generating the bit patterns, which permits a less complex digital DEM circuit that provides improved performance.

In accordance with an exemplary embodiment, the proposed DEM algorithm introduces a new priority calculation method. In accordance with this exemplary embodiment, a multi-bit quantizer can be used in an oversampled delta sigma modulator to produce an output which is converted to an output code, such as a thermometer code output. The thermometer code output can be fed through a dynamic element matching sort block to provide an output comprising a plurality of output bits. Each output bit of the dynamic element matching sort block can be sampled and fed back to each of a plurality of corresponding filters, which comprise cascaded integrators. The sort block is configured to compare the respective outputs of the filters and to shuffle the input bits, i.e., the thermometer code output, to generate an output such that the output values of the corresponding filters converge towards each other. In this way, the bit sequence on each output bit line of the sort block will have the noise-shaping, with the order determined by the number of integrators cascaded in the signal path of each filter. The resultant output signals can then be provided to a multi-bit DAC. At the output of the multi-bit DAC, an analog filter can be configured to remove out-of-band noise, leaving the signal band having an improved signal-to-noise (SNR) with the non-linearity components removed.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and;

FIG. 7 illustrates an exemplary sequence table for a DEM application in accordance with an exemplary embodiment of the present invention.

DETAILED DESCRIPTION

Figure 1A:
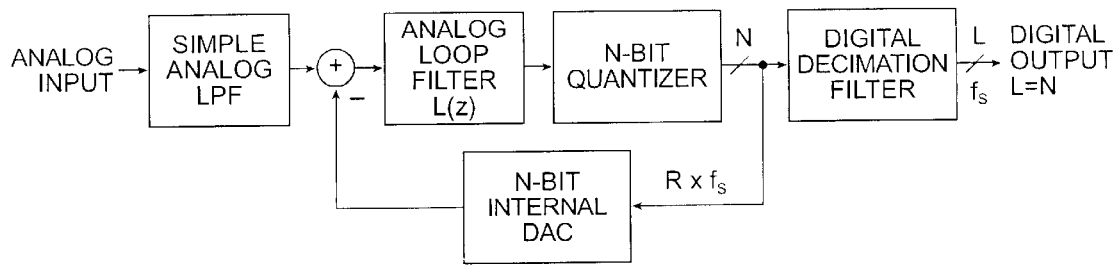
FIG. 1A illustrates a block diagram of a prior art ADC circuit.
Figure 1B:
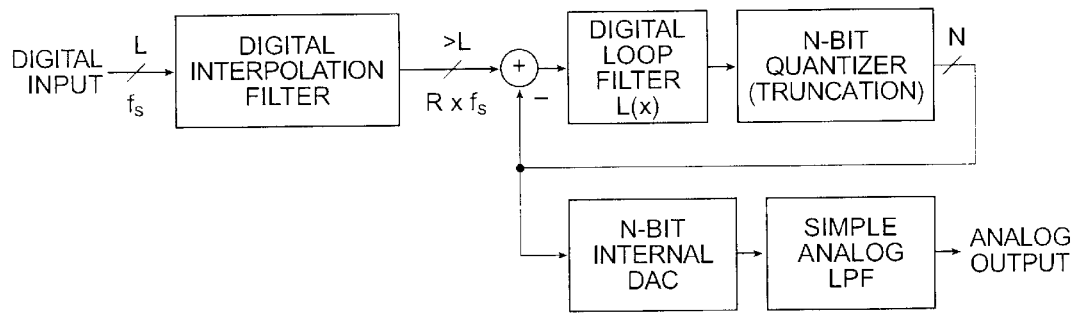
FIG. 1B illustrates a block diagram of a prior art DAC circuit.
Figure 2:
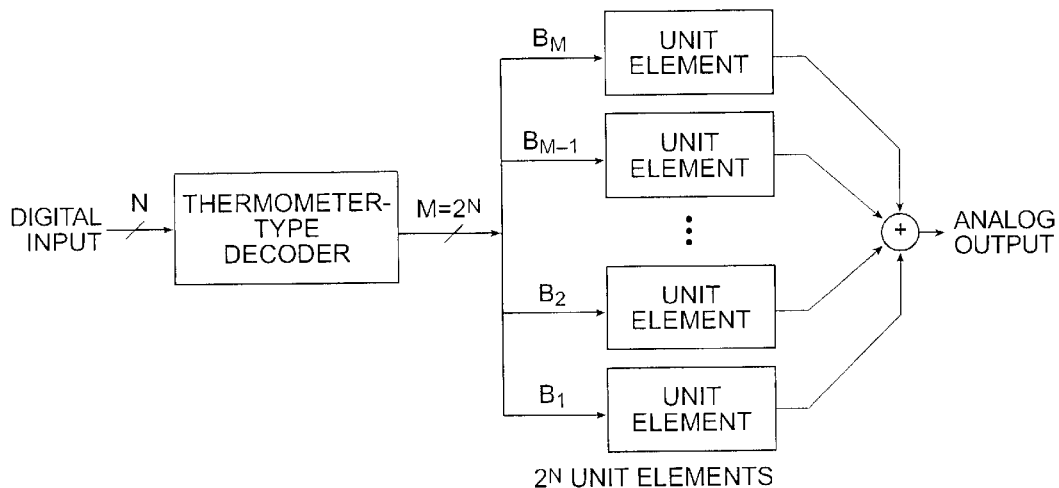
FIG. 2 illustrates a block diagram of a prior art parallel-unit element DAC.
Figure 3:
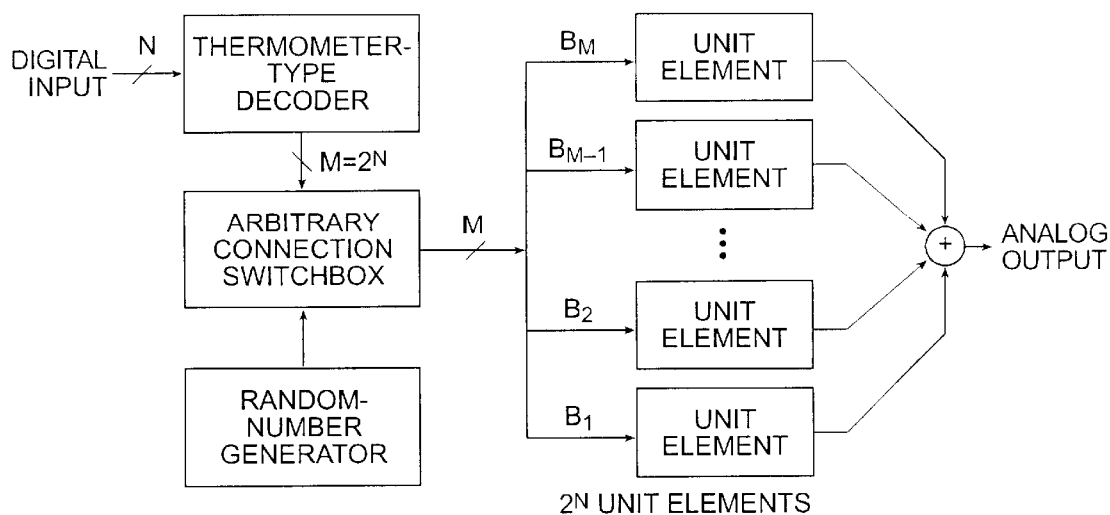
FIG. 3 illustrates a block diagram of a prior art parallel-unit element internal DAC topology including randomization for element selection.
Figure 4:
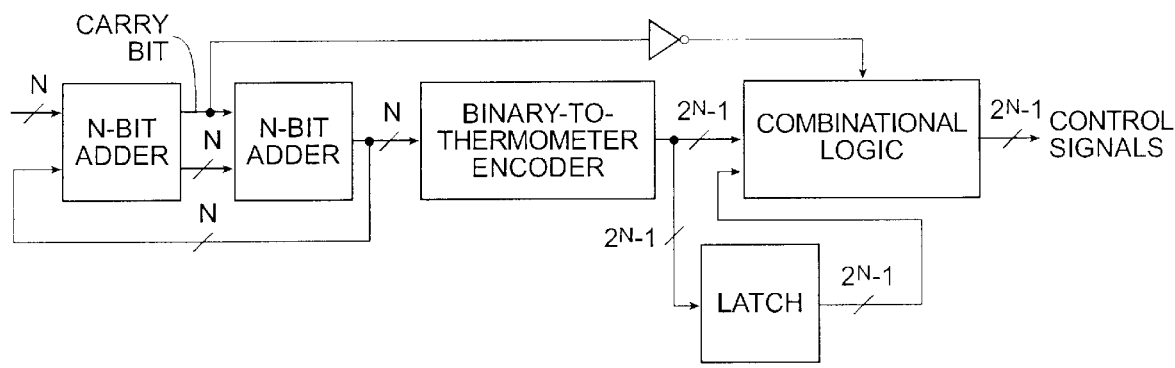
FIG. 4 illustrates a block diagram of a prior art internal DAC topology including individual level averaging with an addition implementation for element selection.

The present invention may be described herein in terms of various functional components and various processing steps. It should be appreciated that such functional components may be realized by any number of hardware or structural components configured to perform the specified functions. For example, the present invention may employ various integrated components, e.g., buffers, voltage references, current mirrors, signal processors and the like, comprised of various electrical devices, e.g., resistors, transistors, capacitors, diodes and other components whose values may be-suitably configured for various intended purposes. In addition, the present invention may be practiced in any integrated circuit application where a multi-bit quantizer can be utilized. Such general applications that may be appreciated by those skilled in the art in light of the present disclosure are not described in detail herein. However for purposes of illustration only, exemplary embodiments of the present invention will be described herein in connection with multi-bit, delta-sigma digital-to-analog converter. Further, it should be noted that while various components may be suitably coupled or connected to other components within exemplary circuits, such connections and couplings can be realized by direct connection between components, by connection or coupling through other components and devices located therebetween, or any other manner of feeding one component into another component or device.

As previously described, a multi-bit digital-to-analog converter utilizing a multi-bit quantizer with an oversampled delta-sigma modulator generally introduces non-linearity because of mismatch, which causes a distortion on the input signal to the modulator. This distortion is usually present as harmonics of the input signal, which is a serious problem in many data converter applications. In addition, prior art DEM techniques have resulted in complexity and higher costs, and are generally limited for 1st order noise-shaping. However, in accordance with the present invention, an improved dynamic element matching technique for providing noise-shaping of the non-linearity in data converters, such as a multi-bit digital-to-analog converter, is provided. The improved DEM technique is configured with a new method for generating the bit patterns, which can lead to a less complex digital DEM circuit, which also can provide improved performance.

In accordance with an exemplary embodiment, an exemplary DEM circuit addresses the non-linearity by transforming the non-linear error caused by mismatch into random noise which can be noise shaped by changing the bit pattern of the data such that most of the noise falls outside the signal band. In addition, the output of the delta-sigma modulator can then be fed into a redundant code format encoder, such as, for example, a thermometer code encoder, to provide a thermometer code representative of the input signal.

In accordance with one aspect of the present invention, the proposed DEM algorithm introduces a new priority calculation method. In accordance with this exemplary embodiment, a multi-bit quantizer can be used in an over-sampled delta sigma modulator to produce an output, which is converted to an output code, such as a thermometer code output. This conversion can be provided, for example, by an encoder configured within the modulator. The thermometer code output can be fed through a dynamic element matching sort block to provide an output comprising a plurality of output bits. Each output bit of the dynamic element matching sort block can be sampled and fed back to each of a plurality of corresponding spectral or noise-shaping filters, which comprise cascaded integrators. The sort block is configured to compare the respective output of each filter and to shuffle the input bits, i.e., the thermometer code output bits, to generate an output such that the output values of the corresponding filters converge towards each other. In this way, the bit sequence on each output bit line of the sort block will have spectral or noise-shaping, with the order determined by the number of integrators cascaded in the signal path of each filter. The resultant output signals of the sort block can then be provided to a multi-bit DAC, such as an N-bit internal DAC. The output of the DAC can then be passed through an analog filter, such as a low-pass filter, to remove out-of-band noise, leaving the signal band having an improved signal-to-noise (SNR) with the non-linearity components removed.

Figure 5:
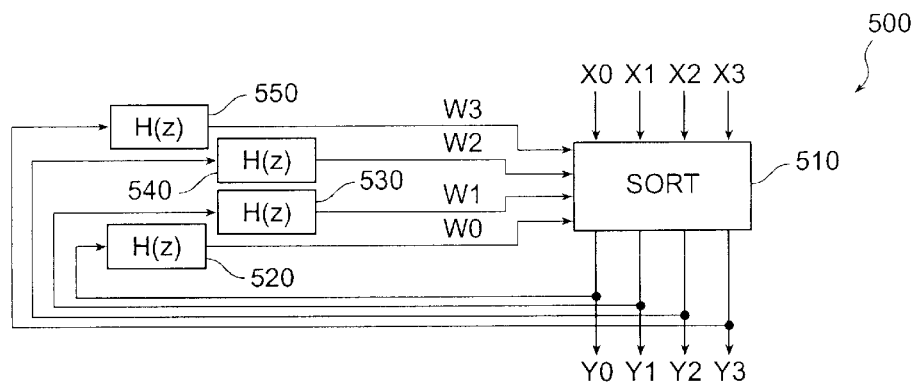
FIG. 5 illustrates an exemplary architecture for a DEM application in accordance with an exemplary embodiment of the present invention.

Referring now to FIG. 5, a block diagram of an architecture 500 depicting an exemplary embodiment of the present invention utilizing dynamic element matching (DEM) is illustrated. Although a 4-bit example of the DEM technique is utilized for explanation purposes, it should be understood that the illustrative embodiment can be extended to utilize any number of bits.

Again, and by way of example and not by way of limitation, utilizing a 4-bit DEM technique, an exemplary DEM circuit 500 comprises a sort block 510, and a plurality of noise-shaping filters 520, 530, 540 and 550. An input to the dynamic element matching sort block 510 comprises a redundant 4-bit thermometer code, X0, X1, X2 and X3, with the output code being encoded from the digital signals and provided by a delta-sigma modulator output, e.g., an N-bit quantizer. Utilizing a 4-bit thermometer code, sort block 510 is provided with five possible thermometer code inputs (0 0 0 0), (0 0 0 1), (0 0 1 1), (0 1 1 1) and (1 1 1 1), representing five levels of −1, −0.5, 0, 0.5 and 1, respectively. In the exemplary embodiment, sort block 510 provides four outputs, Y0, Y1, Y2 and Y3, which can be provided to an N-bit internal DAC. The signals of each of the outputs Y0–Y3 are sampled and coupled into the inputs of noise-shaping filters 520, 530, 540 and 550, respectively.

While not shown in detail, noise-shaping filters 520–550 comprise cascaded integrators utilized in performing the noise-shaping functions, which can be determined by the number of integrators cascaded in the signal path of each noise-shaping filter 520–550. Sort block 510 is configured to receive outputs W0, W1, W2 and W3 from noise-shaping filters 520, 530, 540 and 550, respectively.

In operation, sort block 510 can be suitably configured to shuffle the input bits, X0–X3, based on the comparison results of the output W0–W3 from noise-shaping filters 520–550 to generate output bits Y0–Y3 such that the resulting output bits Y0–Y3 can make the output values W0–W3 from noise-shaping filters 520–550 approach each other, i.e., substantially the same in value. Accordingly, the bit sequence on each output bit line Y0–Y3 can have the noise-shaping determined by the number of integrators cascaded in the signal path of each noise-shaping filter 520–550.

Figure 6:
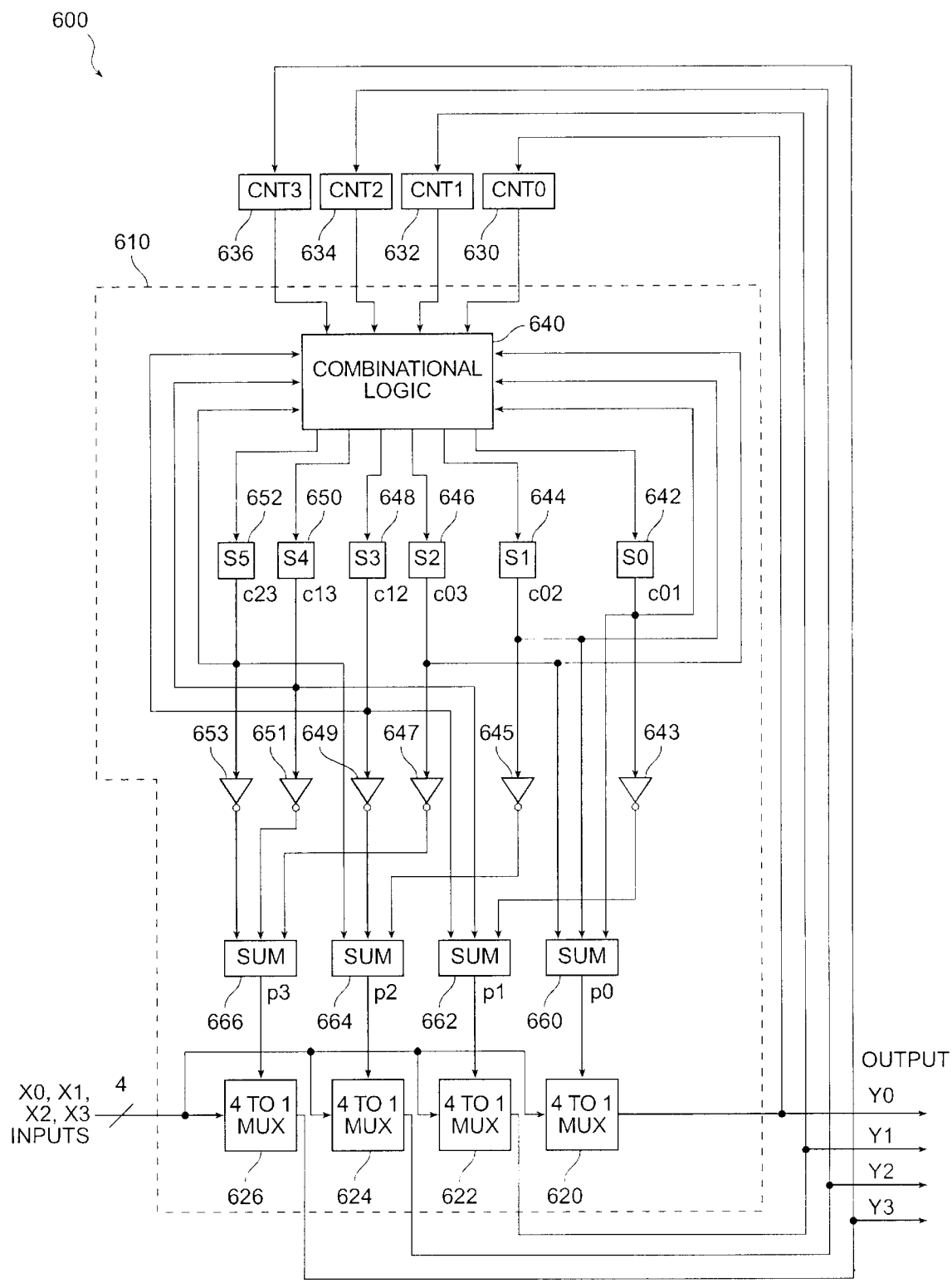
FIG. 6 illustrates another exemplary DEM application in accordance with an exemplary embodiment of the present invention.

In accordance with another exemplary embodiment of the present invention, with reference to FIG. 6, an exemplary dynamic element matching circuit 600 is configured to provide for at least one integrator on each bit feedback path, while at the same time providing for a shuffle state to be stored so that the next shuffled decision will be based on both the value of each integrator and the last shuffle state. In this manner, the proposed DEM may achieve first order, second order, and so on, noise-shaping performance.

While the DEM circuit 600 illustrates a 4-bit input sample, it should again be appreciated that this configuration is for illustration purposes only, and that any number of input bits can be suitably utilized in accordance with various other exemplary embodiments of the present invention. For example, as few as 2 bits, or 32 bits, or 1028 bits or any other number of bits can be suitably utilized.

DEM circuit 600 is shown to include four input lines X0, X1, X2 and X3, such as provided from a thermometer decoder in a thermometer code format, with each of input lines X0, X1, X2 and X3 being coupled into sort block 610, which comprises a combinational logic unit 640, a plurality of comparison status elements 642, 644, 646, 648, 650, 652, inverters 643, 645, 647, 649, 651, 653, adders 660, 662, 664 and 666, and multiplexors 620, 622, 624 and 626.

In this exemplary embodiment, each input line X0, X1, X2 and X3 is coupled into all four multiplexors 620, 622, 624 and 626. Multiplexors 620, 622, 624 and 626 provide signal outputs Y0, Y1, Y2 and Y3, respectively. In this example, multiplexors 620, 622, 624 and 626 are configured for 4-to-1 multiplexing.

Additionally, each signal output Y0–Y3 is configured to also be coupled into a corresponding noise-shaping filter. In this exemplary embodiment, noise-shaping filters 520, 530, 540 and 550 comprise corresponding counters, CNT0 (630), CNT1 (632), CNT2 (634) and CNT3 (636), respectively.

Each counter CNT0 (630), CNT1 (632), CNT2 (634) and CNT3 (636), has an output coupled into combinational logic unit 640 within sort block 510. Combinational logic unit 640 provides six outputs, each coupled into an individual "D"-type flip-flop, each comprising a comparison status element, S0 (642), S1 (644), S2 (646), S3 (648), S4 (650) and S5 (652), respectively. Each comparison status element 642, 644, 646, 648, 650 and 652 has an output represented by cij, where the output of S0 (642) is c01, S1 (644) is c02, S2 (646) is c03, S3 (648) is c12, S4 (650) is c13, and S5 (652) is c23.

Each output cij is suitably coupled to at least two of adders 660, 662, 664 and 666, either directly or through one of inverters 643, 645, 647, 649, 651 and 653, and is suitably coupled back to combinational logic unit 640. For example, output c01 is coupled directly into adder 660, through inverter 643 and into adder 662, and back into combinational logic unit 640; output c02 is coupled directly into adder 660, through inverter 645 and into adder 664, and back into combinational logic unit 640; output c03 is coupled directly into adder 660, through inverter 647 and into adder 666, and back into combinational logic unit 640; output c12 is coupled directly into adder 662, through inverter 649 and into adder 664, and back into combinational logic unit 640; output c13 is coupled directly into adder 662, through inverter 651 and into adder 666, and back into combinational logic unit 640; and output c23 is coupled directly into adder 664, through inverter 653 and into adder 666, and back into combinational logic unit 640.

Adders 660, 662, 664 and 666 each provide an output p0, p1, p2 and p3, respectively, which are coupled into 4-to-1 multiplexor 620, 4-to-1 multiplexor 622, 4-to-1 multiplexor 624 and 4-to-1 multiplexor 626, respectively.

In the illustrative embodiment, DEM circuit 600 is suitably configured with 4-bit input data bits X0, X1, X2 and X3, which can be suitably provided to all four 4-to-1 multiplexors, 620, 622, 624 and 626, with each separate multiplexor configured to pick up one input bit X0–X3. The 4-to-1 multiplexors are configured to shuffle each input bit X0–X3 to one of output lines Y0–Y3, based on the corresponding pi values, i=0,1,2 and 3, provided from four full adders 660, 662, 664 and 666.

Because of the thermometer code nature, when the input bits are connected to multiplexors 620, 622, 624 and 626 properly, the priority that an output obtains a level "1" is suitably determined by the pi value corresponding to the associated multiplexor such that the smaller a pi value, the higher the priority of the corresponding output bit from the associated multiplexor will receive a "1". Each pi is provided from one of four full adders (660, 662, 664 and 666), each of that is configured with a 2-bit output. The logic is configured in such a way that the values of pi, i=0,1,2 and 3, are all different from each other. As a result, none of X0, X1, X2, and X3 is dropped or repeated at the DEM output, Y0, Y1, Y2, and Y3.

As discussed, each output bit Y0–Y3 is configured to be coupled back to a corresponding counter, 630, 632, 634 and 636, respectively. Counters 630, 632, 634 and 636 are configured to count the number of "1's" appearing on each output bit line Y0–Y3. Based on the value of each counter and the previous state, each 1-bit priority state representing the relative priority of two output bits to get a '1' is updated. Thus, there are a total of six relative priority bits used for a 4-bit output, which can be provided from comparison status elements S0–S5.

The number of comparison status elements needed for N bit DEM can be determined from the equation CS=1+2+ . . . N−1. Thus, for example, for N=4 bits, CS=1+2+3=6 comparison status elements. In this example, the output of each comparison status element S0–S5 has a relative priority bit cij, where cij is c01, c02, c03, c12, c13 and c23, which is set to a "0" when Yi has higher priority than Yj to get a '1,' otherwise, priority bit cij is set to "1". Therefore, we have priority bit cji=1−cij, which can be implemented by inverters 643, 645, 647, 649, 651 and 653.

For output bits, Yi and Yj, where i, j=0, 1, 2 or 3 and i≠j, when the values in CNTi and CNTj are the same, relative priority bit cij or cji remains unchanged. When the value in CNTi is greater than that in CNTj, relative priority bit cij is set to 1 or relative priority bit cji is set to "0". Conversely, when the value in CNTi is less than that in CNTj, relative priority bit cij is set to "0" or relative priority bit cji is set to "1". Accordingly, relative priority values for each bit can be suitably added in full adders 660, 662, 664 and 666 to obtain the pi values for that bit. Thus, the overall priority value pi for that bit can be used as the select signal to the corresponding multiplexor. Since the algorithm described above always keeps the difference among all counter values within one, only one bit is needed for each counter.

With reference to FIG. 7, an exemplary state sequence table for the counters 630, 632, 634 and 636, priority bits cij, input bits X0–X3, and output bits Y0–Y3 is provided.

After sort block 610 shuffles the input bits X0–X3 and provide an output signal Y0–Y3 such that the output values of counters 630–636 converge toward each other, the resultant output signals Y0–Y3 can then be provided to a multi-bit internal DAC. At the output of the multi-bit DAC, an analog low-pass filter can be configured to remove out-of-band noise, leaving the signal band having an improved signal-to-noise (SNR) with the non-linearity components removed. Accordingly, the noise-shaping technique of the present invention results in most of the noise in the signal band being transferred to the out-of-band region where it can be easily filtered out. As a result, the overall signal-to-noise ratio (SNR) inside the signal band is improved.

Figure 8:
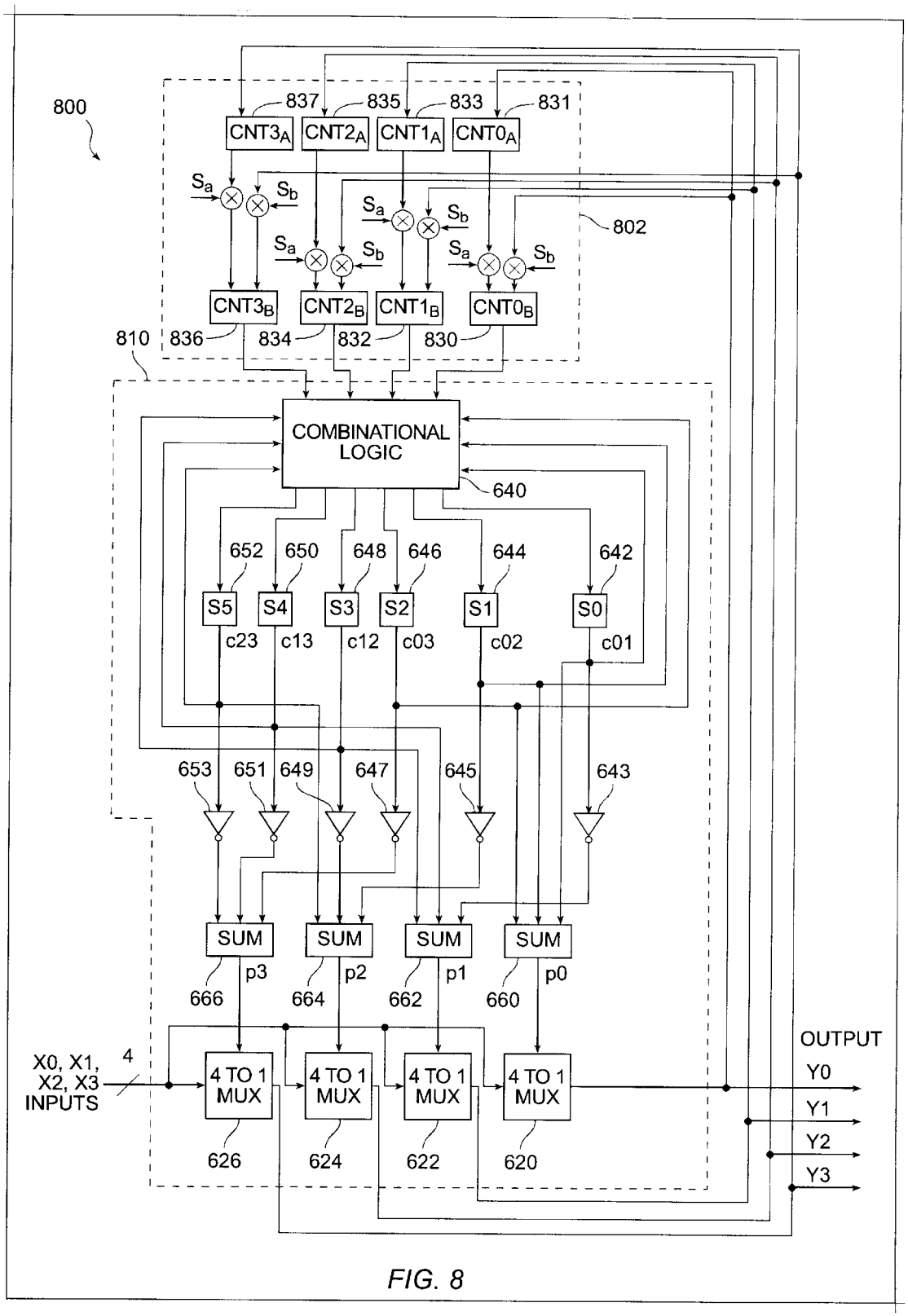
FIG. 8 illustrates another exemplary DEM application in accordance with an exemplary embodiment of the present invention.

In accordance with another aspect of the present invention, the above exemplary embodiment can also be further configured to achieve 2nd order noise-shaping or better. For example, with reference to FIG. 8, an additional counter can be added to each input, e.g., a $CNT0_A$ and a $CNT0_B$, with the output bit Y0 feeding into the first counter, $CNT0_A$, and with the output of first counter $CNT0_A$ being fed again with the output bit Y0 to a second counter $CNT0_B$ through scaling by scaling devices $S_a$ and $S_b$, which then can be coupled to the combinational logic 640. Scaling devices $S_a$ and $S_b$ can comprise any suitably device or component configured for scaling of output bits Y0–Y3 and outputs of CNT0A, CNT1A, CNT2A and CNT3A. Additional counters $CNT1_B$, $CNT2_B$, and $CNT3_B$ can also be provided. As a result, the second order noise-shaping can be achieved. Moreover, additional counters and logic than those illustrated above can be implemented to address even higher orders of noise-shaping.

The present invention has been described above with reference to an exemplary embodiment. However, those skilled in the art will recognize that changes and modifications may be made to the exemplary embodiment without departing from the scope of the present invention. For example, the various components may be implemented in alternate ways, such as, for example, by hardware or software implementations, e.g., the functions of the multiplexors, adders and flip-flops can be replaced by other software applications. In addition, while the various exemplary embodiments of the present invention are configured with DAC devices, the present invention is also applicable to, and can be configured with, ADC devices, such as oversampled delta-sigma ADC devices. These alternatives can be suitably selected depending upon the particular application or in consideration of any number of factors associated with the operation of the system. In addition, the techniques described herein may be extended or modified for use with other components besides digital-to-analog converter. These and other changes or modifications are intended to be included within the scope of the present invention.

What is claimed is:

1. A modulator system configured for removing non-linearity errors associated with component value mismatches in a data converter, said modulator system comprising:

a quantizer for receiving a plurality of digital input signals and encoding each of said plurality of digital input signals into a separate redundant code format signal comprising a plurality of input bits;

a dynamic element matching (DEM) sort block configured for receiving each of said plurality of input bits, for shuffling said plurality of input bits contained in said redundant code format signals, and for providing a plurality of output bits having noise-shaping characteristics;

a plurality of noise-shaping filters configured to sample each of said plurality of output bits from said DEM sort block and provide a plurality of filtered output signals coupled to said DEM sort block, said plurality of filtered output signals being configured by said DEM sort block such that values of said plurality of filtered output signals converge toward each other to facilitate movement of any random noise signals to an out-of-band location;

an internal multi-bit DAC configured for receiving said plurality of output bits from said DEM sort block, and providing as DAC output; and an analog filter coupled to receive said DAC output for removing any out-of-band noise from said shuffled bit patterns, wherein said redundant code format signals are in thermometer code format.

2. A modulator system configured for removing non-linearity errors associated with component value mismatches in a data converter, said modulator system comprising:

a quantizer for receiving a plurality of digital input signals and encoding each of said plurality of digital input signals into a separate redundant code format signal comprising a plurality of input bits;

a dynamic element matching (DEM) sort block configured for receiving each of said plurality of input bits, for shuffling said plurality of input bits contained in said redundant code format signals, and for providing a plurality of output bits having noise-shaping characteristics;

a plurality of noise-shaping filters configured to sample each of said plurality of output bits from said DEM sort block and provide a plurality of filtered output signals coupled to said DEM sort block, said plurality of filtered output signals being configured by said DEM sort block such that values of said plurality of filtered output signals converge toward each other to facilitate movement of any random noise signals to an out-of-band location;

an internal multi-bit DAC configured for receiving said plurality of output bits from said DEM sort block, and providing as DAC output; and an analog filter coupled to receive said DAC output for removing any out-of-band noise from said shuffled bit patterns, wherein said noise-shaping filters comprise cascaded integrators for providing said plurality of filtered output signals for comparison by said DEM sort block.

3. A modulator system configured for removing non-linearity errors associated with component value mismatches in a data converter, said modulator system comprising:

a quantizer for receiving a plurality of digital input signals and encoding each of said plurality of digital input signals into a separate redundant code format signal comprising a plurality of input bits;

a dynamic element matching (DEM) sort block configured for receiving each of said plurality of input bits, for shuffling said plurality of input bits contained in said redundant code format signals, and for providing a plurality of output bits having noise-shaping characteristics;

a plurality of noise-shaping filters configured to sample each of said plurality of output bits from said DEM sort block and provide a plurality of filtered output signals coupled to said DEM sort block, said plurality of filtered output signals being configured by said DEM sort block such that values of said plurality of filtered output signals converge toward each other to facilitate movement of any random noise signals to an out-of-band location;

an internal multi-bit DAC configured for receiving said plurality of output bits from said DEM sort block, and providing as DAC output; and an analog filter coupled to receive said DAC output for removing any out-of-band noise from said shuffled bit patterns, wherein said DEM sort block is configured to shuffle said plurality of input bits based on comparison results of said filtered output signals of said noise-shaping filters to generate said plurality of output bits such that values of said filtered output signals converge to substantially similar values.

4. A modulator system configured for removing non-linearity errors associated with component value mismatches in a data converter, said modulator system comprising:

a quantizer for receiving a plurality of digital input signals and encoding each of said plurality of digital input signals into a separate redundant code format signal comprising a plurality of input bits;

a dynamic element matching (DEM) sort block configured for receiving each of said plurality of input bits, for shuffling said plurality of input bits contained in said redundant code format signals, and for providing a plurality of output bits having noise-shaping characteristics;

a plurality of noise-shaping filters configured to sample each of said plurality of output bits from said DEM sort block and provide a plurality of filtered output signals coupled to said DEM sort block, said plurality of filtered output signals being configured by said DEM sort block such that values of said plurality of filtered output signals converge toward each other to facilitate movement of any random noise signals to an out-of-band location;

an internal multi-bit DAC configured for receiving said plurality of output bits from said DEM sort block, and providing as DAC output; and an analog filter coupled to receive said DAC output for removing any out-of-band noise from said shuffled bit patterns, wherein said DEM sort block comprises a plurality of multiplexors configured for shuffling said plurality of input bits.

5. The system of claim 4, wherein said DEM sort block comprises a combinational logic unit configured for receiving said filtered output signals of said noise-shaping filters, with said filtered output signals of said noise-shaping filters comprising N bits for first-order noise shaping.

6. The system of claim 5, wherein said DEM sort block comprises a plurality of comparison status elements for facilitating comparison of said filtered output signals of said noise-shaping filters with each other.

7. The system of claim 6, wherein said plurality of comparison status elements comprises a number equal to 1+2+ . . . N−1 elements.

8. A dynamic element matching (DEM) circuit configured for reducing non-linearity errors caused by mismatch within a DAC, said dynamic element matching circuit comprising:
   a DEM sort block configured for receiving a redundant output code comprising a plurality of input bits from a modulator, and for shuffling said plurality of input bits contained in said redundant output code to provide a plurality of output signals having noise-shaping characteristics;
   a plurality of noise-shaping filters configured to sample each of said plurality of output signals from said DEM sort block and provide filtered output signals coupled to said DEM sort block to facilitate movement of any random noise signals to an out-of-band location; and
   wherein said DEM sort block is configured to shuffle said plurality of input bits based on comparison results of said filtered output signals of said noise-shaping filters such that values of said filtered output signals converge to substantially similar values,
   wherein said redundant output code is in thermometer code format.

9. A dynamic element matching (DEM) circuit configured for reducing non-linearity errors caused by mismatch within a DAC, said dynamic element matching circuit comprising:
   a DEM sort block configured for receiving a redundant output code comprising a plurality of input bits from a modulator, and for shuffling said plurality of input bits contained in said redundant output code to provide a plurality of output signals having noise-shaping characteristics;
   a plurality of noise-shaping filters configured to sample each of said plurality of output signals from said DEM sort block and provide filtered output signals coupled to said,DEM sort block to facilitate movement of any random noise signals to an out-of-band location; and
   wherein said DEM sort block is configured to shuffle said plurality of input bits based on comparison results of said filtered output signals of said noise-shaping filters such that values of said filtered output signals converge to substantially similar values,
   wherein said noise-shaping filters comprise cascaded integrators for providing said filtered output signals.

10. The system of claim 9, wherein noise-shaping functions can be determined by an amount of said cascaded integrators within a signal path of each of said noise-shaping filters.

11. A dynamic element matching (DEM) circuit configured for reducing non-linearity errors caused by mismatch within a DAC, said dynamic element matching circuit comprising:
   a DEM sort block configured for receiving a redundant output code comprising a plurality of input bits from a modulator, and for shuffling said plurality of input bits contained in said redundant output code to provide a plurality of output signals having noise-shaping characteristics;
   a plurality of noise-shaping filters configured to sample each of said plurality of output signals from said DEM sort block and provide filtered output signals coupled to said DEM sort block to facilitate movement of any random noise signals to an out-of-band location; and
   wherein said DEM sort block is configured to shuffle said plurality of input bits based on comparison results of said filtered output signals of said noise-shaping filters such that values of said filtered output signals converge to substantially similar values,
   wherein said noise-shaping filters comprise a plurality of counters configured to identify status of each bit of said plurality of output bits.

12. The system of claim 11, wherein said plurality of counters comprises a first group of counters connected directly to said sort block and a second group of counters coupled to said first group of counters such that second order noise-shaping can be achieved by said system.

13. A dynamic element matching (DEM) circuit configured for reducing non-linearity errors caused by mismatch within a DAC, said dynamic element matching circuit comprising:
   a DEM sort block configured for receiving a redundant output code comprising a plurality of input bits from a modulator, and for shuffling said plurality of input bits contained in said redundant output code to provide a plurality of output signals having noise-shaping characteristics;
   a plurality of noise-shaping filters configured to sample each of said plurality of output signals from said DEM sort block and provide filtered output signals coupled to said DEM sort block to facilitate movement of any random noise signals to an out-of-band location; and
   wherein said DEM sort block is configured to shuffle said plurality of input bits based on comparison results of said filtered output signals of said noise-shaping filters such that values of said filtered output signals converge to substantially similar values,
   said DEM sort block comprises a plurality of multiplexors configured for shuffling said plurality of input bits.

14. A dynamic element matching (DEM) circuit configured for reducing non-linearity errors caused by mismatch within a DAC, said dynamic element matching circuit comprising:
- a DEM sort block configured for receiving a redundant output code comprising a plurality of input bits from a modulator, and for shuffling said plurality of input bits contained in said redundant output code to provide a plurality of output signals having noise-shaping characteristics;
- a plurality of noise-shaping filters configured to sample each of said plurality of output signals from said DEM sort block and provide filtered output signals coupled to said DEM sort block to facilitate movement of any random noise signals to an out-of-band location; and
- wherein said DEM sort block is configured to shuffle said plurality of input bits based on comparison results of said filtered output signals of said noise-shaping filters such that values of said filtered output signals converge to substantially similar values,
- wherein said DEM sort block comprises a combinational logic unit configured for receiving said filtered output signals of said noise-shaping filters, with said filtered output signals comprising N bits for first-order noise shaping.

15. The system of claim 14, wherein said DEM sort block comprises a plurality of comparison status elements for facilitating comparison of said filtered output signals of said noise-shaping filters, said comparison status elements being updated by said combinational logic unit.

16. The system of claim 15, wherein said plurality of comparison status elements comprises a number equal to 1+2+ . . . N−1 elements.

17. A dynamic element matching technique configured for reducing the non-linearity within a data converter, said technique comprising the steps of:
- receiving a plurality of redundant code format signals in a DEM sort block configured to provide a plurality of output bits;
- sampling said plurality of output bits and providing said sampled bits into a plurality of corresponding noise-shaping filters;
- comparing filtered output signals provided from said plurality of corresponding noise-shaping filters; and
- shuffling input bits from said redundant code format signals to generate said plurality of output bits such that said output signals from said plurality of corresponding noise-shaping filters converge to substantially similar values,
- wherein said technique further comprises the step of providing said plurality of redundant code format signals from a modulator.

18. A dynamic element matching technique configured for reducing the non-linearity within a data converter, said technique comprising the steps of:
- receiving a plurality of redundant code format signals in a DEM sort block configured to provide a plurality of output bits;
- sampling said plurality of output bits and providing said sampled bits into a plurality of corresponding noise-shaping filters;
- comparing filtered output signals provided from said plurality of corresponding noise-shaping filters; and
- shuffling input bits from said redundant code format signals to generate said plurality of output bits such that said output signals from said plurality of corresponding noise-shaping filters converge to substantially similar values,
- wherein said technique further comprises the steps of providing said plurality of output bits through an internal multi-bit DAC, and providing an output of said multi-bit DAC to an analog low-pass filter to remove out-of-band noise and thus reduce non-linearity caused by mismatch.

19. A dynamic element matching technique configured for reducing the non-linearity within a data converter, said technique comprising the steps of:
- receiving a plurality of redundant code format signals in a DEM sort block configured to provide a plurality of output bits;
- sampling said plurality of output bits and providing said sampled bits into a plurality of corresponding noise-shaping filters;
- comparing filtered output signals provided from said plurality of corresponding noise-shaping filters; and
- shuffling input bits from said redundant code format signals to generate said plurality of output bits such that said output signals from said plurality of corresponding noise-shaping filters converge to substantially similar values,
- wherein said technique further comprises performing noise-shaping functions based on a number of cascaded integrators within a signal path of each of said noise-shaping filters.

20. A dynamic element matching technique configured for reducing the non-linearity within a data converter, said technique comprising the steps of:
- receiving a plurality of redundant code format signals in a DEM sort block configured to provide a plurality of output bits;
- sampling said plurality of output bits and providing said sampled bits into a plurality of corresponding noise-shaping filters;
- comparing filtered output signals provided from said plurality of corresponding noise-shaping filters; and
- shuffling input bits from said redundant code format signals to generate said plurality of output bits such that said output signals from said plurality of corresponding noise-shaping filters converge to substantially similar values,
- wherein said step of sampling comprises utilizing a plurality of counters within said noise-shaping filters to identify status of each output bit of said sort block.

21. The technique of claim 20, wherein said step of sampling comprises utilizing a first group of counter coupled to said sort block and a second group of counters coupled to said first group of counters such that second order noise-shaping can be achieved.

22. A dynamic element matching technique configured for reducing the non-linearity within a data converter, said technique comprising the steps of:
- receiving a plurality of redundant code format signals in a DEM sort block configured to provide a plurality of output bits;
- sampling said plurality of output bits and providing said sampled bits into a plurality of corresponding noise-shaping filters;
- comparing filtered output signals provided from said plurality of corresponding noise-shaping filters; and
- shuffling input bits from said redundant code format signals to generate said plurality of output bits such that said output signals from said plurality of corresponding noise-shaping filters converge to substantially similar values, wherein said step of comparing said filtered output signals comprises receiving an output signals from a plurality of counters in a combinational logic unit and updating comparison status bits cij in a plurality of comparison status elements.

23. The technique of claim 22, wherein said step of updating said comparison status bits cij is based on said output signals from a plurality of counters and any previous comparison status bits cij.

24. The technique of claim 22, wherein said step of comparing said filtered output signal further comprises adding comparison status bits cij between a corresponding comparison status element and any other comparison status elements to generate a priority value for a corresponding output bit of said DEM sort block to receive a "1" priority bit.

25. A dynamic element matching technique configured for reducing the non-linearity within a data converter, said technique comprising the steps of:

receiving a plurality of redundant code format signals in a DEM sort block configured to provide a plurality of output bits;

sampling said plurality of output bits and providing said sampled bits into a plurality of corresponding noise-shaping filters;

comparing filtered output signals provided from said plurality of corresponding noise-shaping filters; and shuffling input bits from said redundant code format signals to generate said plurality of output bits such that said output signals from said plurality of corresponding noise-shaping filters converge to substantially similar values, wherein said step of shuffling comprises shuffling with a separate multiplexor each of said input bits to one of said plurality of output bits based on said priority value.

* * * * *